(12) United States Patent
Hiroshima

(10) Patent No.: US 7,922,960 B2
(45) Date of Patent: Apr. 12, 2011

(54) FINE RESIST PATTERN FORMING METHOD AND NANOIMPRINT MOLD STRUCTURE

(75) Inventor: Masahito Hiroshima, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 12/155,651

(22) Filed: Jun. 6, 2008

(65) Prior Publication Data
US 2009/0001634 A1    Jan. 1, 2009

(30) Foreign Application Priority Data

Jun. 28, 2007    (JP) ................................. 2007-170485

(51) Int. Cl.
*B29C 35/08* (2006.01)
(52) U.S. Cl. ........................................ 264/496; 977/887
(58) Field of Classification Search .................. 264/293, 264/319, 496; 977/887
See application file for complete search history.

(56) References Cited

U.S. PATENT DOCUMENTS

| | | | |
|---|---|---|---|
| 4,268,603 A * | 5/1981 | Sato | 430/196 |
| 4,732,841 A * | 3/1988 | Radigan | 430/311 |
| 6,842,229 B2 * | 1/2005 | Sreenivasan et al. | 355/75 |
| 2003/0217804 A1 * | 11/2003 | Guo et al. | 156/230 |
| 2005/0233262 A1 | 10/2005 | Luo et al. | |

FOREIGN PATENT DOCUMENTS

| | | |
|---|---|---|
| JP | 2005-328020 | 11/2005 |
| JP | 2006-269936 | 10/2006 |
| JP | 2006-287012 | 10/2006 |

OTHER PUBLICATIONS

Yonemitsu, H., T. Kawazoe, M. Ohtsu, Nanofabrication using Nonadiabatic Near-Field Photolithography, 2005 5th IEEE Conference on Nanotechnology, (Jul. 2005), pp. 456-459.*
Cheng, X., L. Jay Guo, One-step lithography for various size patterns with a hybrid mask-mold, Microelectronic Engineering, vol. 71 (2004), pp. 288-293.*

* cited by examiner

*Primary Examiner* — Christina Johnson
*Assistant Examiner* — Galen Hauth
(74) *Attorney, Agent, or Firm* — McGinn IP Law Group, PLLC

(57) ABSTRACT

A light-transmitting mold structure having a mold pattern corresponding to a portion to form a pattern by nanoimprint and a conductive film pattern corresponding to a portion to form a pattern by nonadiabatic near-field exposure is used to irradiate UV light from a back surface of the mold structure and to perform nonadiabatic near-field light exposure in an imprint process so that all patterns having various sizes for simulating various designs can be faithfully transferred by a single imprint process (imprint & UV exposure).

19 Claims, 5 Drawing Sheets

FINE RESIST PATTERN FORMING METHOD AND NANOIMPRINT MOLD STRUCTURE

This application is based upon and claims the benefit of priority from Japanese patent application No. 2007-170485, filed on Jun. 28, 2007, the disclosure of which is incorporated herein in its entirety by reference.

BACKGROUND OF THE INVENTION

1. Field of the Invention

The present invention relates to a fine resist pattern forming method capable of forming an LSI circuit pattern containing a nanoimprint pattern and an ultrafine pattern of several tens nm or less by one imprint process on a wafer and a nanoimprint mold structure for the same.

2. Related Art

A lithography technique for forming an ultrafine pattern has made advances to shorten the wavelength of an exposure light source thereof and provide a high NA of a projector lens and now can form a pattern having hp (half pitch) of about 45 nm with a wavelength (ArF) $\lambda=193$ nm in the following expression.

$$\text{Resolution} = k1 \times \lambda / NA$$

However, the resolution limit of an ArF immersion exposure technology is considered to be within hp 35 nm to 39 nm. Therefore, at present, there is no lithography tool capable of mass-producing an LSI at the hp 32 nm or less as a post ArF immersion exposure technology.

On the one hand, of the exposure tools promising for practical use, an attention has been drawn to nanoimprint technology and nonadiabatic near-field light exposure technology as a technique for providing a high resolution with lowest cost. Nanoimprint is a technique for patterning by pressing a template referred to as a mold against a resin and can faithfully transfer a fine pattern formed on a mold surface. However, the degree of technical difficulty is extremely high in that a mold pattern needs to be formed with a high precision because the mold pattern is of the same size as the transfer pattern.

On the other hand, an attention is drawn to a nonadiabatic near-field light exposure technology as a technique for forming an ultrafine pattern. According to the nonadiabatic near-field light exposure technology, a photomask on which a pattern is formed on a glass substrate with a conductive material is provided in proximity to a surface of a resist deposited on a substrate surface; when a nonresonant light (light having longer wavelength than that of light corresponding to a resonance energy between molecules constituting a resist film) of a wavelength band other than the photosensitive band of the resist is irradiated onto the resist, surface plasmons are generated around an edge portion of a light shielding conductive film by near-field light (including evanescent light) and an adjacent resist portion is exposed to light. To date, experiments using a G line ($\lambda=435$ nm) and i line ($\lambda=365$ nm) as excitation light have confirmed that a pattern can be formed on the order of a minimum 10 nm.

However, when an LSI pattern is considered, both an ultrafine pattern and a large scale pattern need to be formed, but in general, the nonadiabatic near-field light exposure technology cannot support various pattern sizes because a pattern thereof is formed by surface plasmons around a pattern edge portion (Japanese Patent Laid Open No. 2005-328020). Another method has been proposed in which excitation light is irradiated from the substrate side to which a pattern is transferred and a transfer size is controlled by plasmons on a surface of a convex portion of a mask pattern (Japanese Patent Laid Open No. 2006-269936). Unfortunately, the method has the same problem as the nanoimprint mold fabrication because the process size of the mask pattern needs to be ultrafine. A still another method of combining nanoimprint and nonadiabatic near-field light exposure technology has been proposed in which both side portions of a pattern formed by nanoimprint are exposed to near-field light and the resist is dissolved by development and the pattern is slimmed by dry etching. Unfortunately, the method also has a problem in that the pattern pitch cannot be miniaturized even by the effect of nonadiabatic near-field light exposure because the minimum process size depends on the mold process size (Japanese Patent Laid Open No. 2006-287012).

SUMMARY OF THE INVENTION

An object of the present invention is to provide a new exposure technology including the essence of nanoimprint technology and nonadiabatic near-field light exposure technology in an LSI fabrication at hp 32 nm or less, allowing for a more flexible formation of an ultrafine pattern with a high miniaturization capability and an extremely high productivity as well.

The present invention proposes a resist process capable of guaranteeing a new mold structure and a print performance with a high precision and stability in which an ultrafine pattern (10 nm or less or micro-sized area difficult for mold processing) is formed by nonadiabatic near-field light exposure and any other sized pattern is formed by nanoimprint for the purpose that all patterns having various sizes for simulating various designs can be faithfully transferred by a single imprint process (imprint & UV irradiation).

The new mold structure is a light-transmitting mold structure comprising a mold pattern corresponding to a portion to form a pattern by nanoimprint and a conductive film pattern corresponding to a portion to form a pattern by nonadiabatic near-field light exposure, and more specifically is a structure comprising concave and convex patterns formed on a light-transmitting substrate, wherein the convex patterns correspond to a portion to form a pattern by nanoimprint and a conductive film pattern corresponds to a portion to form a pattern by nonadiabatic near-field light exposure formed in consecutive concave pattern portions.

In addition, the present invention provides a fine resist pattern forming method by transferring an ultrafine pattern having a line width of 10 nm or less with nonadiabatic near-field light exposure and other sized pattern with nanoimprint to a photoresist formed on a workpiece substrate, said method comprising:

providing a light-transmitting mold structure having a mold pattern corresponding to a portion to form a pattern by nanoimprint and a conductive film pattern corresponding to a portion to form a pattern by nonadiabatic near-field exposure;

imprinting the mold pattern to the photoresist and simultaneously irradiating nonresonant light of a wavelength band other than the photosensitive band of said photoresist from a back surface of the light-transmitting mold structure; and performing exposure by nonadiabatic near-field light generated at each edge portion of said conductive film pattern.

According to the fine resist pattern forming method in accordance with the present invention, it is preferable that a cured resin film serving as a stopper is formed between the substrate onto which a pattern is transferred and the photoresist.

According to the present invention, the height of a convex pattern formed on the mask (mold) surface is set to have different heights between the nanoimprint portion and the near-field light exposure portion (conductive film pattern) and the single mask (mold) can be used to form a practical LSI pattern having various sizes and pattern arrangement pitches including an ultrafine pattern by a single nanoimprint process. Further, when the mask (mold) is pressed against the substrate, the spacing between the substrate and the mask (mold) at the time of imprinting can be controlled with a precision on the order of several angstroms by using the cured resin film arranged under the resist layer as a stopper film at the time of imprint. This enables a robust nonadiabatic near-field exposure independent of a deformation of the mask (mold) or the substrate because the distance between the mask (mold) and the resist at the time of nonadiabatic near-field light exposure can be maintained with a high precision.

As a result, a practical LSI pattern formation and an ultrafine pattern formation on the order of 10 nm or less which are difficult to achieve by nonadiabatic near-field light exposure alone or nanoimprint lithography alone can be achieved with a lower cost and a simple process method by using a mold having a new structure and a multilayer film process with an increased pressing precision.

DETAILED DESCRIPTION OF THE PREFERRED EMBODIMENTS

Hereinafter, exemplary embodiments of the present invention will be described in detail with reference to drawings.

Figure 1:
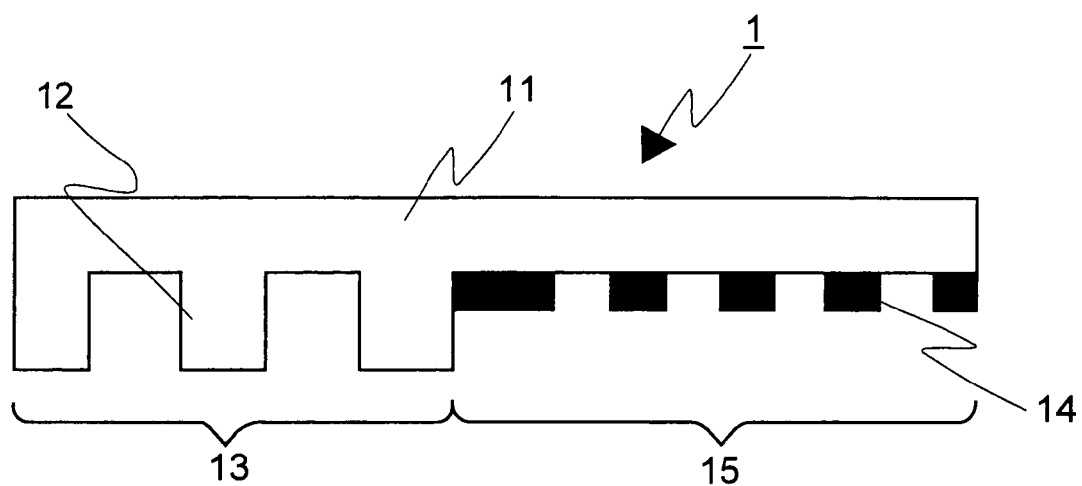
FIG. 1 is a rough cross-sectional view showing an exemplary embodiment of the mold structure in accordance with the present invention.

FIG. 1 is a rough cross-sectional view of mold structure (hereinafter referred to as mold) 1 in accordance with the present invention. Mold 1 is formed such that the surface of glass material substrate 11 such as glass and quartz allowing nonresonant light, such as UV light, (hereinafter referred to as UV light, but not limited to this) of a wavelength band other than the photosensitive band of a photoresist to pass through is formed into a concave-convex surface. Convex portion 12 constitutes nanoimprint pattern portion 13, and conductive film pattern 14 formed in consecutive concave portions constitutes nonadiabatic near-field light exposure pattern portion 15.

In order to perform transfer onto a resist film formed on a workpiece substrate using mold 1, press convex portion 12 of mold 1 so as to pass through a resist film, irradiate UV light from the mold back surface (surface opposite to the surface on which convex portion 12 is formed) in that state, generate near-field light in nonadiabatic near-field light exposure pattern portion 15, expose the resist to the near-field light, remove the mold, and then remove the portion exposed to the near-field light by development and dissolution. As a result, a large-size resist pattern can be formed in nanoimprint pattern portion 13 and an ultrafine resist pattern can be formed in nonadiabatic near-field light exposure pattern portion 15 at the same time.

Further, as shown in FIG. 2, according to the present invention, cured resin film 3 is formed on wafer substrate 4 serving as a workpiece substrate so as to be formal with respect to wafer substrate 4 lying thereunder (in a state where the film surface after film formation becomes flat regardless of concavity and convexity of the surface lying thereunder) and is used as a stopper when the mold is pressed against. More specifically, when the mold is imprinted onto the wafer substrate, the end surface of a convex portion of the concave-convex pattern formed on the mold passes through resist film 2 and stops at an interface between resist film 2 and cured resin film 3. In this state, the process height of a mold pattern and the thickness of the resist film are set so that the end surface of a nonadiabatic near-field light exposure pattern portion formed with a conductive film is just in contact with the surface of resist film 2. This allows nanoimprint pattern portion 13 and nonadiabatic near-field light exposure pattern portion 15 can form simultaneously each corresponding pattern with high controllability and stability by UV irradiation at the time of imprint. Here, cured resin film 3 is formed by applying a thermosetting resin or a photocurable resin over wafer substrate 4 and curing it by heat or light. For example, a UV curable resin for UV nanoimprint lithography and the like can be used. The UV curable resin for UV nanoimprint lithography is an organic material that a polymer forming the resin is condensed and cured by UV light irradiation and is used as an imaging layer in a general nanoimprint lithography process. A mask (mold) made of a light-transmitting material (e.g., glass) is pressed against the resin, and then UV light is irradiated from the back surface of the mask (mold) through the mask (mold) onto the UV curable resin film. The resin film is cured in a state where the resin film is kept to be pressed with the concave-convex pattern of the mask (mold), and then the mask (mold) pattern is transferred to the resin film.

According to the present invention, cured resin film 3 formed on wafer substrate 4 mentioned above is used for the purpose of serving as a stopper film which prevents the mask (mold) from exceeding a predetermined depth when the mask (mold) is pressed against the resist applied substrate. Photoresist 2 is a material which does not have a photosensitive band in a wavelength of the irradiated UV light, but has a property of showing a solubility to an alkaline developer in the nonadiabatic near-field light exposure portion as well as comprises an organic solvent making possible to increase the resist viscosity in an UV irradiation portion. Such a photoresist is formed on the cured resin film 3 serving as the stopper so as to be in a formal state with respect to wafer substrate 4. A spin-coating method is used as the method for forming cured resin film 3 and photoresist 2, by which the material is dropped and applied onto the substrate and then the substrate is rotated at a high speed to spread the material over the entire surface. This method allows the coated film thickness to be control on the order of several angstroms.

Mold 1 is formed by processing the surface of glass material substrate 11 such as glass which transmits UV light. The detailed fabrication method will be described later, but pattern portion 13 formed for nanoimprint transfer is formed such that convex portion 12 is formed on the glass material substrate surface by a glass substrate engraving process (dry etching process using a plasma energy). On this occasion, nonadiabatic near-field light exposure pattern portion 15 is all engraved therein and the bottom of the concave portion (the process side of the mask (mold) is seen upward) becomes flat (FIG. 1).

Subsequently, conductive film 14 is formed on substrate 11 mentioned above and then conductive film 14 is processed as a pattern for nonadiabatic near-field exposure formed on the conductive film. Further, the conductive film formed on nanoimprint pattern portion 13 is removed (dry ashing process using a plasma or the like) to fabricate the mask (mold) in accordance with the present invention. Here, the conductive film needs to be formed conformally (with a fixed film thickness along the concave-convex surface lying thereunder) with respect to substrate 11 with a concave-convex surface lying thereunder. Therefore, a CVD technique or the like is used which can control the film thickness at an atom level by depositing atoms ionized by a thermal dissociation reaction in the gas phase or a separation reaction between material molecules by a plasma energy on the substrate (FIG. 1).

Since nonadiabatic near-field light exposure pattern portion 15 forms a pair of line patterns at both edges of the end portion of a mask pattern formed by conductive film pattern 14 of mold 1, the conductive film pattern size of mold 1 has a line width determined by adding a pair of line pattern intervals to twice (a pair of two patterns) the one-half of the adjacent line pattern width (because conductive film pattern edge corresponds to the pattern center position) for a pair of the line patterns to be formed. For example, assuming that the line pattern width is 10 nm and an interval between the adjacent line patterns is 90 nm, the conductive film pattern width is 100 nm.

The height of convex pattern 12 of mold 1 in nanoimprint pattern portion 13 (the processed side of the mold is seen upward) is determined by adding the film thickness of a resist layer to be transferred the pattern to the film thickness of a light shielding conductive film in nonadiabatic near-field exposure portion. More specifically, as shown in FIG. 2A, the height is determined so that conductive film pattern 14 comes close to resist film 2 at the time of nanoimprint.

Figure 2A:
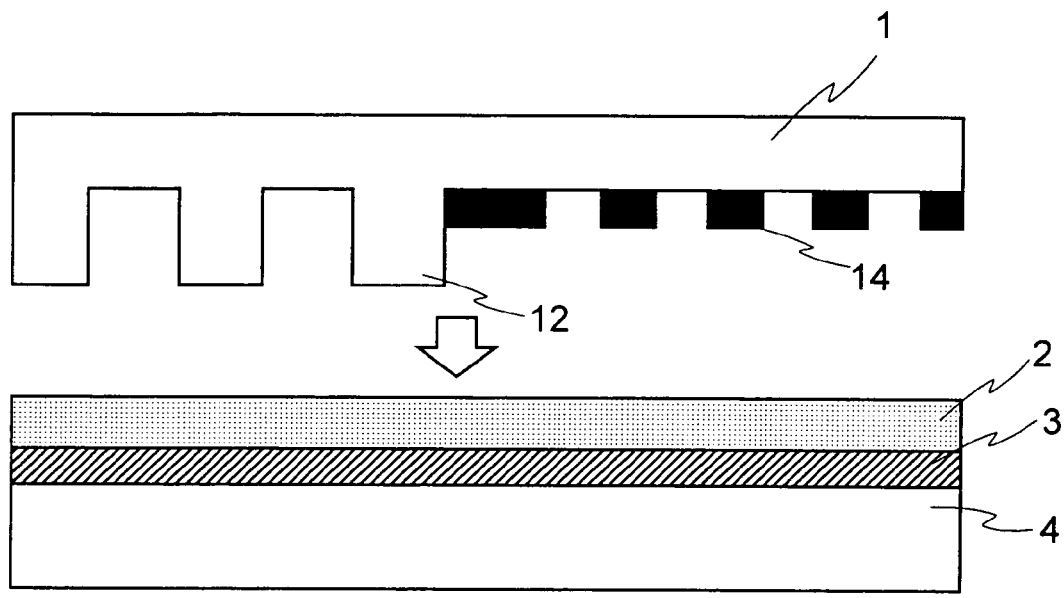
FIGS. 2A to 2E are process cross-sectional views showing the fine resist pattern forming method in accordance with the present invention.
Figure 2B:
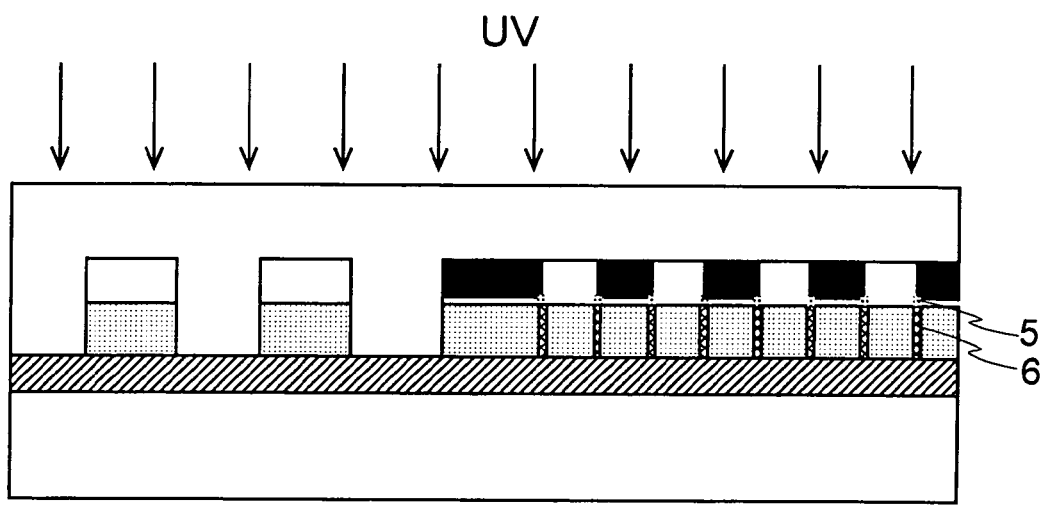
Figure 2C:
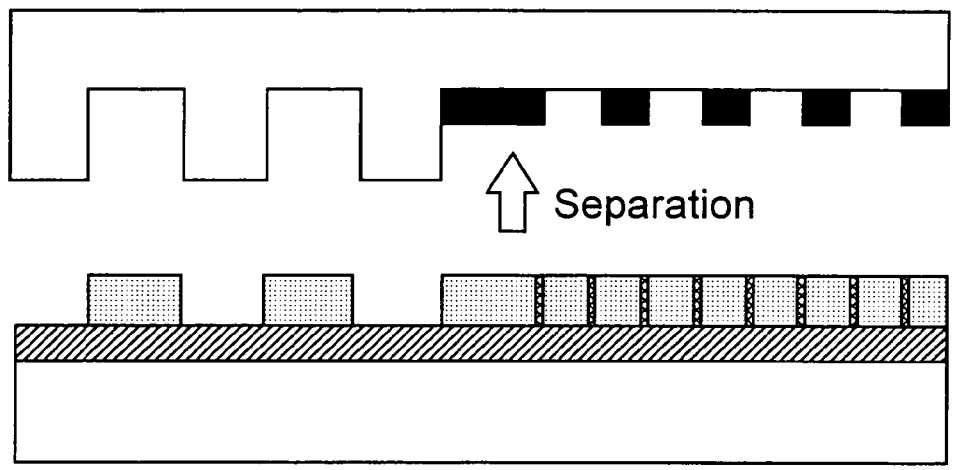
Figure 2D:
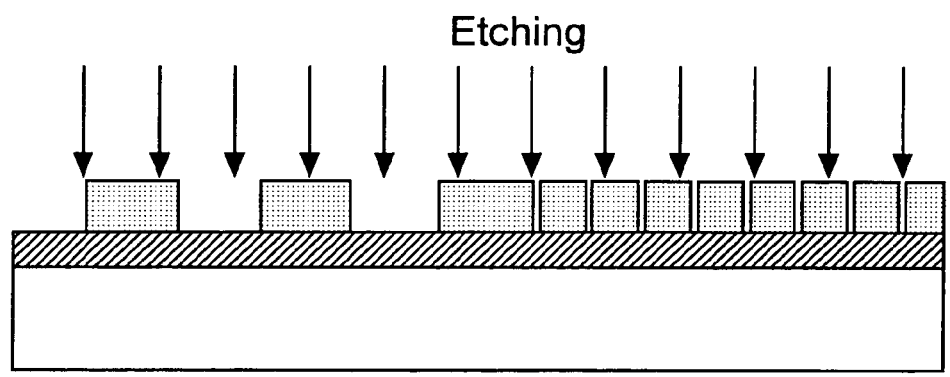
Figure 2E:
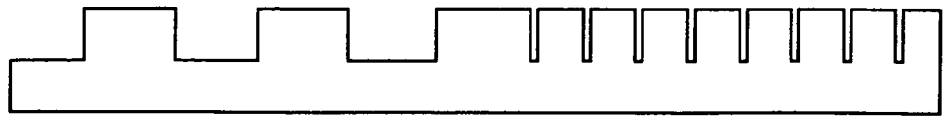

FIGS. 2A to 2E show a process of forming a practical LSI pattern provided with an ultrafine pattern and a rough size pattern using the aforementioned mold. First, mold 1 of the present invention is pressed against resist 2 until the end surface of mold convex portion 12 of the nanoimprint pattern portion is in contact with the top surface of cured resin film 3 serving as a stopper (FIG. 2A). At this time, conductive film pattern 14 serving as a mask for nonadiabatic near-field exposure is held at a position in proximity to the surface of resist 2. In this state, irradiate UV light, generate a high-intensity nonadiabatic near-field light (here, surface plasmons 5) at an edge portion of conductive film pattern 14 and provide latent image 6 of a sharp light energy at a conductive film pattern edge portion thereunder in resist 2 (FIG. 2B). On the other hand, in the nanoimprint portion, the viscosity of the resist is increased by UV light. Therefore, even if the mold is separated, the nanoimprint pattern shape is maintained (FIG. 2C). Finally, the nonadiabatic near-field light exposure portion is developed by alkali aqueous solution. Then, patterns in the nonadiabatic near-field exposure portion are resolved (FIG. 2D). The resist pattern obtained in this way is used as a shield mask. Etching on the stopper layer and the substrate thereunder is performed and consequently all mask (mold) patterns are transferred onto the wafer substrate (FIG. 2E).

As resist 2 used in the present invention, as described above, a material can be used which does not have a photosensitive band to a wavelength of the irradiated UV light, but has a property of showing a solubility to an alkaline developer in the nonadiabatic near-field light exposure portion as well as comprises an organic solvent making possible to increase the resist viscosity in an irradiation portion of a UV light which is a nonresonant light. That is, a resist material, which does not have a photosensitive band in a wavelength of the irradiated UV light, but has a photosensitive band in a wavelength shorter than the UV light, dissolved or suspended in a solvent containing a compound having an unsaturated bond such as methyl methacrylate to adjust a viscosity to become suitable for nanoimprint, can be used. Alternatively, a resist material may be used in which crosslinks thereof are accelerated by heating at the same time of nanoimprint, and the crosslinks are disconnected in nonadiabatic near-field light exposure portion to increase solubility of the material. Further, after the mask (mold) is removed or after development, the material may be post-baked to further increase the crosslink density of the resist.

The mold fabrication process in accordance with the present invention will be described in detail with reference to FIGS. 3A to 3F.

Figure 3A:
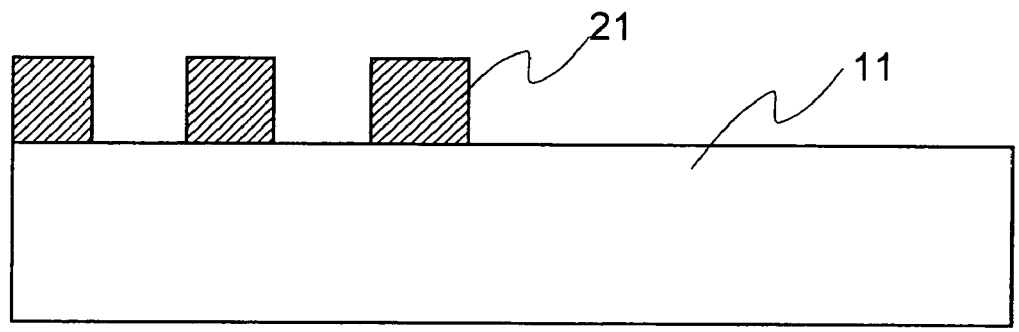
FIGS. 3A to 3F are process cross-sectional views showing the mold fabrication process in accordance with the present invention.
Figure 3B:
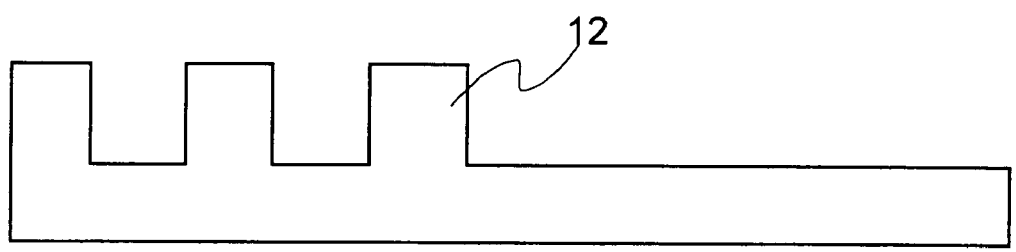

Using a glass substrate used for conventional photomask fabrication, electron beam irradiation resist 21 is formed on the surface of glass substrate 11 and only the pattern to be formed by nanoimprint is transferred by electron beam lithography (FIG. 3A). The glass substrate surface is etched by using resist pattern 21 as a shield mask and convex portion 12 for nanoimprint is formed (FIG. 3B). At this point of time, the portion where a conductive film pattern for nonadiabatic near-field exposure is formed is engraved evenly when the nanoimprint pattern is formed, and thus is seen like a concave portion.

Figure 3C:
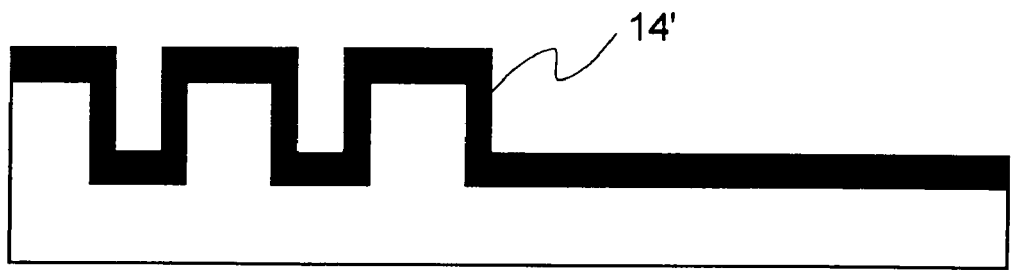

After the remaining resist film used as the shield mask for etching is removed by dry ashing or wafer cleaning, light shielding conductive film 14' is formed with an even thickness across the process surface of glass substrate 11 (FIG. 3C).

Figure 3D:
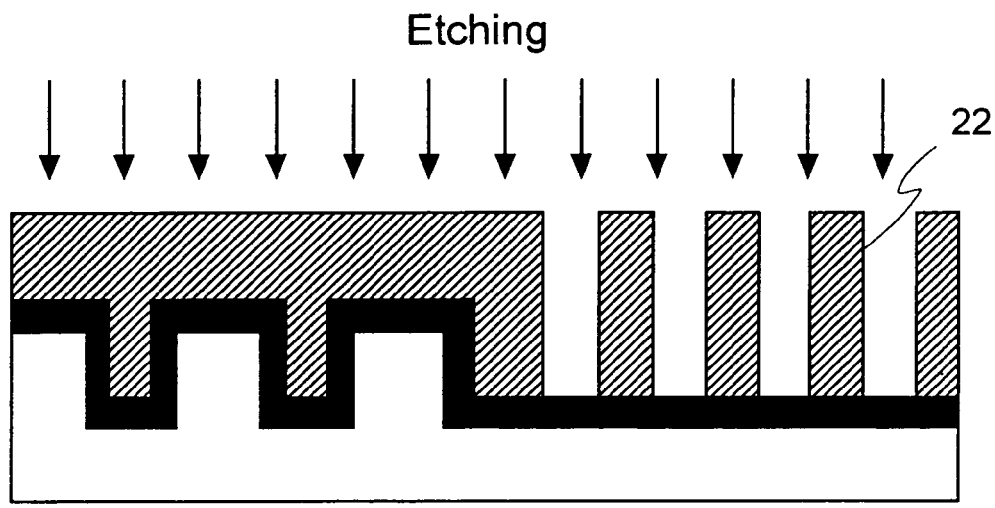
Figure 3E:

Subsequently, electron beam lithography resist 22 is formed on light shielding conductive film 14' and only the pattern to be used for nonadiabatic near-field light exposure is formed by lithography (FIG. 3D). Using the resist pattern as a shield mask for dry etching, the light shielding conductive film is processed and only the light shielding conductive film is remained to form the pattern for nonadiabatic near-field exposure (FIG. 3E).

Figure 3F:
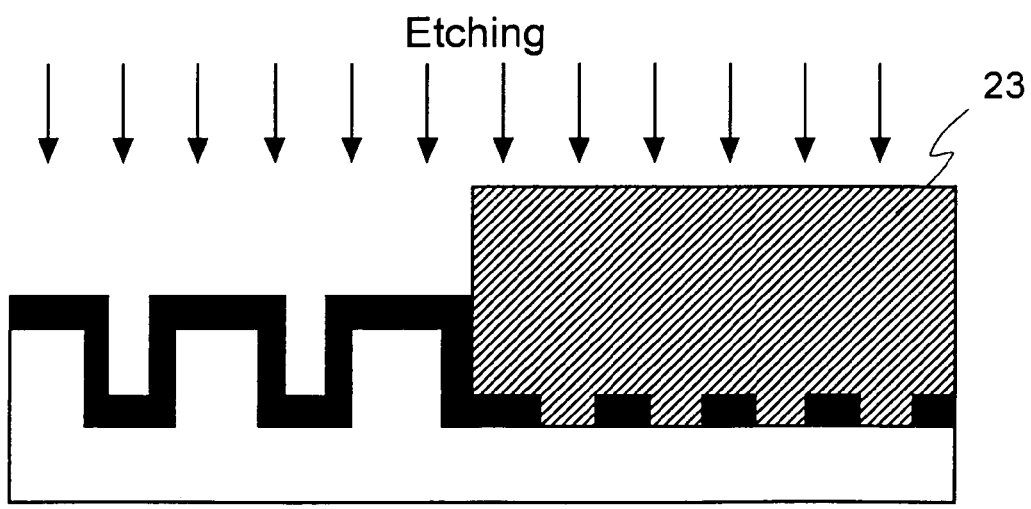

After the remaining resist film used as the shield mask for etching is removed by dry ashing or wafer cleaning, resist layer 23 is formed such that only the nanoimprint pattern is exposed, and using the resist layer as a shield mask for dry ashing, only the light shielding conductive film adhered to the surface of the nanoimprint pattern portion is removed (FIG. 3F).

Other Exemplary Embodiment

In this exemplary embodiment, the light shielding conductive film of the mold according to the above exemplary embodiment is changed with a translucent conductive film so that the conductive film of the nanoimprint pattern portion need not be removed after the nonadiabatic near-field exposure pattern is formed. The translucent conductive film transmits a few percent of UV light. In the state where the translucent conductive film is formed on the surface of the nanoimprint pattern, when the pattern is pressed into the resist and UV light is irradiated, modification of the resist occurs by UV light leaked from the translucent conductive film. This is the reason why the translucent conductive film does not inhibit the pattern formation of nanoimprint portion. Accordingly, a synergistic effect capable of shortening the process of forming a mold pattern by using a translucent conductive film can be expected.

The transfer of a pattern in a portion where the nanoimprint pattern portion and the nonadiabatic near-field light exposure pattern portion are consecutive can be achieved by forming a structure configured such that a circuit pattern is divided into a transfer portion by nanoimprint and a transfer portion by nonadiabatic near-field light exposure; the nanoimprint portion is a convex pattern by glass engraving and the nonadiabatic near-field light exposure portion is a conductive film pattern used in the first exemplary embodiment or the second exemplary embodiment; and the convex pattern is in contact with the conductive film pattern in the boundary portion.

Examples of the present invention include a manufacturing device used to form and process a fine element pattern for use in a semiconductor LSI, a MEMS, an optical device, and a flat panel display.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A fine resist pattern forming method by transferring an ultrafine pattern having a line width of 10 nm or less with nonadiabatic near-field light exposure and other sized pattern with nanoimprint to a photoresist formed on a surface of a workpiece substrate, said method comprising:
providing a light-transmitting mold structure having a mold pattern corresponding to a portion to form a pattern by nanoimprint and a conductive film pattern corresponding to a portion to form a pattern by nonadiabatic near-field exposure, the mold pattern including convex patterns having a height which is equal to the sum of a thickness of the photoresist and a thickness of the conductive film pattern;
imprinting the mold pattern to the photoresist such that the mold pattern contacts the surface of the workpiece substrate, and simultaneously irradiating nonresonant light of a wavelength band other than the photosensitive band of said photoresist from a back surface of the light-transmitting mold structure; and
performing exposure by nonadiabatic near-field light generated at each edge portion of said conductive film pattern.

2. The fine resist pattern forming method according to claim 1, wherein said mold structure comprises concave patterns and the convex patterns formed on a light-transmitting substrate and wherein said convex patterns corresponds to a portion to form a pattern by nanoimprint and said conductive film pattern corresponding to a portion to form a pattern by nonadiabatic near-field light exposure is formed in consecutive concave pattern portions.

3. The fine resist pattern forming method according to claim 1, wherein said conductive film comprises a film having a light shielding effect.

4. The fine resist pattern forming method according to claim 1, wherein said photoresist comprises an organic solvent which has a property of increasing viscosity of the resist by said irradiating said nonresonant light.

5. The fine resist pattern forming method according to claim 1, wherein said workpiece substrate comprises a semiconductor wafer substrate on which a cured resin film is formed, and said photoresist is formed on the cured resin film.

6. A method comprising:
providing a mask including on one side a convex pattern and a conductive film pattern;
providing a substrate having a photoresist layer formed on a surface of the substrate, the convex pattern having a height which is equal to the sum of a thickness of the photoresist layer and thickness of the conductive film pattern;
pressing the convex pattern of the mask to the photoresist layer formed on the substrate such that the convex pattern contacts the surface of the substrate;
irradiating a light to the photoresist layer from another side of the mask to generate a nonadiabatic near-field light at an edge portion of the conductive film pattern, the nonadiabatic near-field light reaching the photoresist layer; and
removing the mask from the substrate to form a photoresist pattern on the substrate.

7. The method according to claim 6, wherein the conductive film pattern is formed on a flat surface of the mask.

8. The method according to claim 6, wherein the mask is provided by nanoimprint technique.

9. The method according to claim 6, wherein the conductive film pattern is formed by an electron beam lithography method.

10. The method according to claim 6, wherein the light has a wavelength band other than a photosensitive band of the photoresist layer.

11. A method comprising:
providing a mask including on one side a first mask pattern and a second mask pattern;
providing a semiconductor substrate having a photoresist layer formed on a surface of the substrate, the first mask pattern including a convex shape having a height which is equal to the sum of a thickness of the photoresist layer and a thickness of the second mask pattern;
pressing the first mask pattern of the mask to the photoresist layer such that the first mask pattern contacts the surface of the substrate;
irradiating a light to the photoresist layer from another side of the mask to generate a nonadiabatic near-field light at an edge portion of the second mask pattern, the nonadiabatic near-field light reaching the photoresist layer;
removing the mask from the semiconductor substrate; and
patterning a surface of the semiconductor substrate to form a photoresist pattern on the semiconductor substrate.

12. The method according to claim 11, wherein the second mask pattern comprises a conductive film pattern formed on a flat surface of the mask.

13. The method according to claim 11, wherein the mask is provided by nanoimprint technique.

14. The method according to claim 12, wherein the conductive film pattern is formed by an electron beam lithography method.

15. The method according to claim 11, wherein the light has a wavelength band other than a phosensitive band of the photoresist layer.

16. The fine resist pattern forming method according to claim 1, wherein in the imprinting of the mold pattern to the photoresist, the mold pattern contacts the surface of a layer on the workpiece substrate which is beneath the photoresist.

17. The fine resist pattern forming method according to claim 1, wherein at a point at which the mold pattern contacts the surface of the workpiece substrate, the conductive film pattern contacts the photoresist film.

18. The fine resist pattern forming method according to claim 1, wherein the convex patterns of said mold pattern protrude from a surface of the mold pattern and said conductive film pattern is formed on said surface, and
wherein the workpiece substrate includes a stopper layer, and imprinting of the mold pattern includes pressing the mold pattern into the photoresist until an end of the convex portion stops at an interface between the photoresist and the stopper layer.

19. The fine resist pattern forming method according to claim 18, wherein a height of the convex patterns and a thickness of the photoresist are set such that an end surface of the conductive film pattern contacts a surface of the photoresist.

* * * * *